United States Patent
Ishii et al.

(10) Patent No.: US 7,501,827 B2
(45) Date of Patent: Mar. 10, 2009

(54) HIGH FREQUENCY COIL DEVICE

(75) Inventors: Manabu Ishii, Otawara (JP); Yutaka Kato, Utsunomiya (JP)

(73) Assignees: Kabushiki Kaisha Toshiba, Tokyo (JP); Toshiba Medical Systems Corporation, Otawara-Shi (JP)

( * ) Notice: Subject to any disclaimer, the term of this patent is extended or adjusted under 35 U.S.C. 154(b) by 0 days.

(21) Appl. No.: 11/924,205

(22) Filed: Oct. 25, 2007

(65) Prior Publication Data

US 2008/0100297 A1    May 1, 2008

(30) Foreign Application Priority Data

Oct. 27, 2006  (JP) .............................. 2006-292973
Sep. 21, 2007  (JP) .............................. 2007-245435

(51) Int. Cl.
*G01V 3/00*  (2006.01)

(52) U.S. Cl. ...................................... 324/322; 324/318

(58) Field of Classification Search ......... 324/300–322; 600/407–422
See application file for complete search history.

(56) References Cited

U.S. PATENT DOCUMENTS 5,473,252 A * 12/1995 Renz et al. .................. 324/318
6,028,429 A * 2/2000 Green et al. ................. 324/318
6,160,400 A * 12/2000 Friedrich et al. ............. 324/322
6,542,768 B1 * 4/2003 Kuth et al. ................... 600/411
6,677,754 B2 * 1/2004 Kestler et al. ................ 324/322
2008/0129298 A1 * 6/2008 Vaughan et al. ............. 324/322

FOREIGN PATENT DOCUMENTS

JP          5-261081       10/1993
JP       2003-265432        9/2003
JP       2005-211188        8/2005

* cited by examiner

*Primary Examiner*—Brij B Shrivastav
(74) *Attorney, Agent, or Firm*—Nixon & Vanderhye PC

(57) ABSTRACT

A magnetic resonance diagnostic apparatus, for receiving a magnetic resonance signal occurred in a subject, includes a plurality of high frequency loop coils arranged so that a part of their inner loop surface overlaps each other in a predetermined direction, and a first electric circuit arranged to overlap the inner loop surface of the plurality of high frequency loop coils in the predetermined direction, at a location where the inner loop surface of the plurality of high frequency loop coils overlaps each other, and including a preamplifier to amplify each of the magnetic resonance signals received by each of the plurality of loop coils.

17 Claims, 6 Drawing Sheets

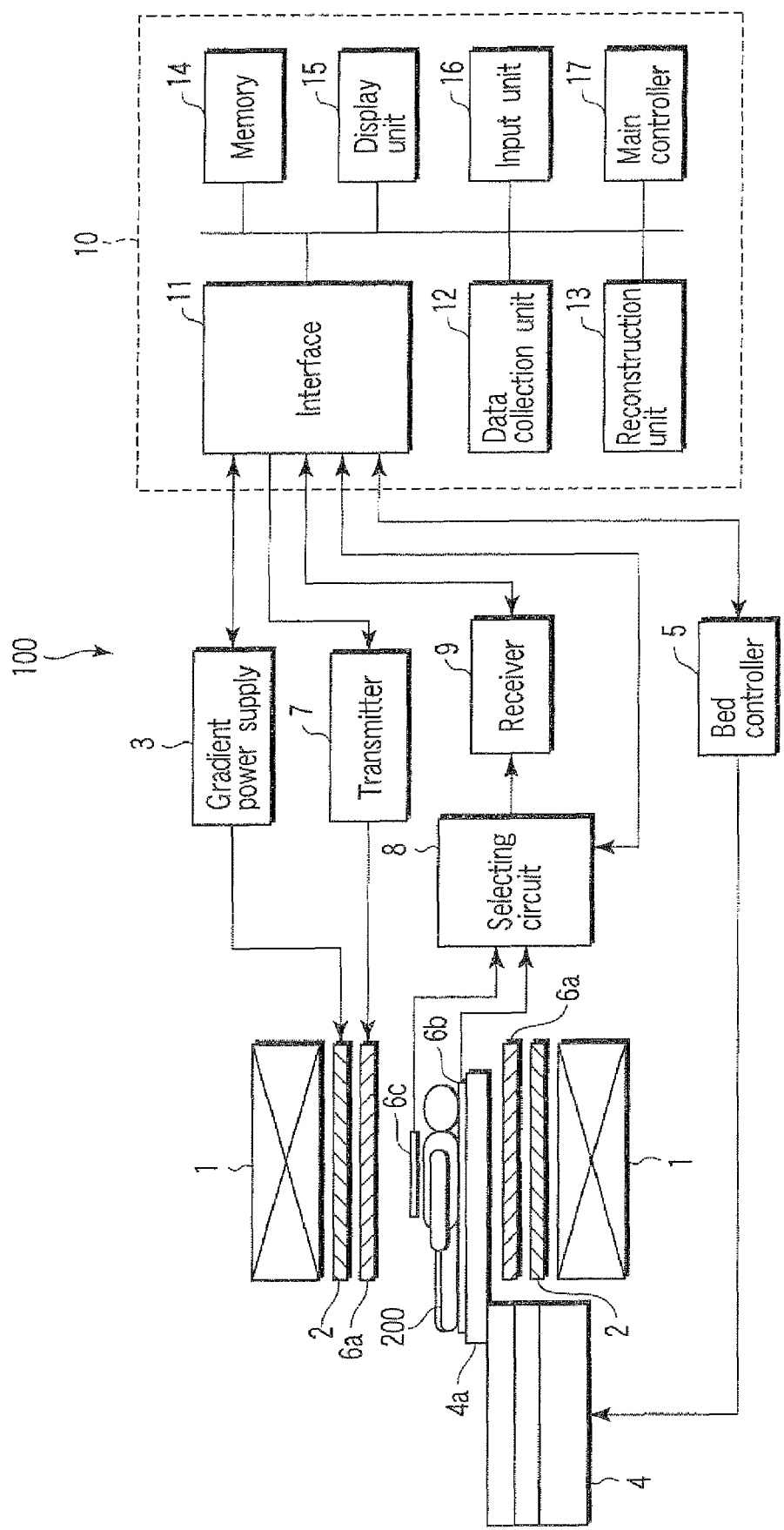
F I G. 1

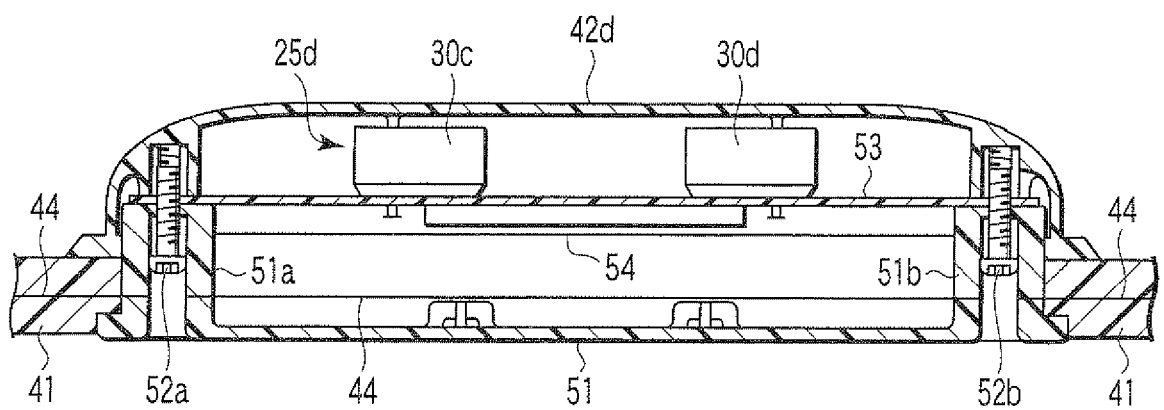
F I G. 6
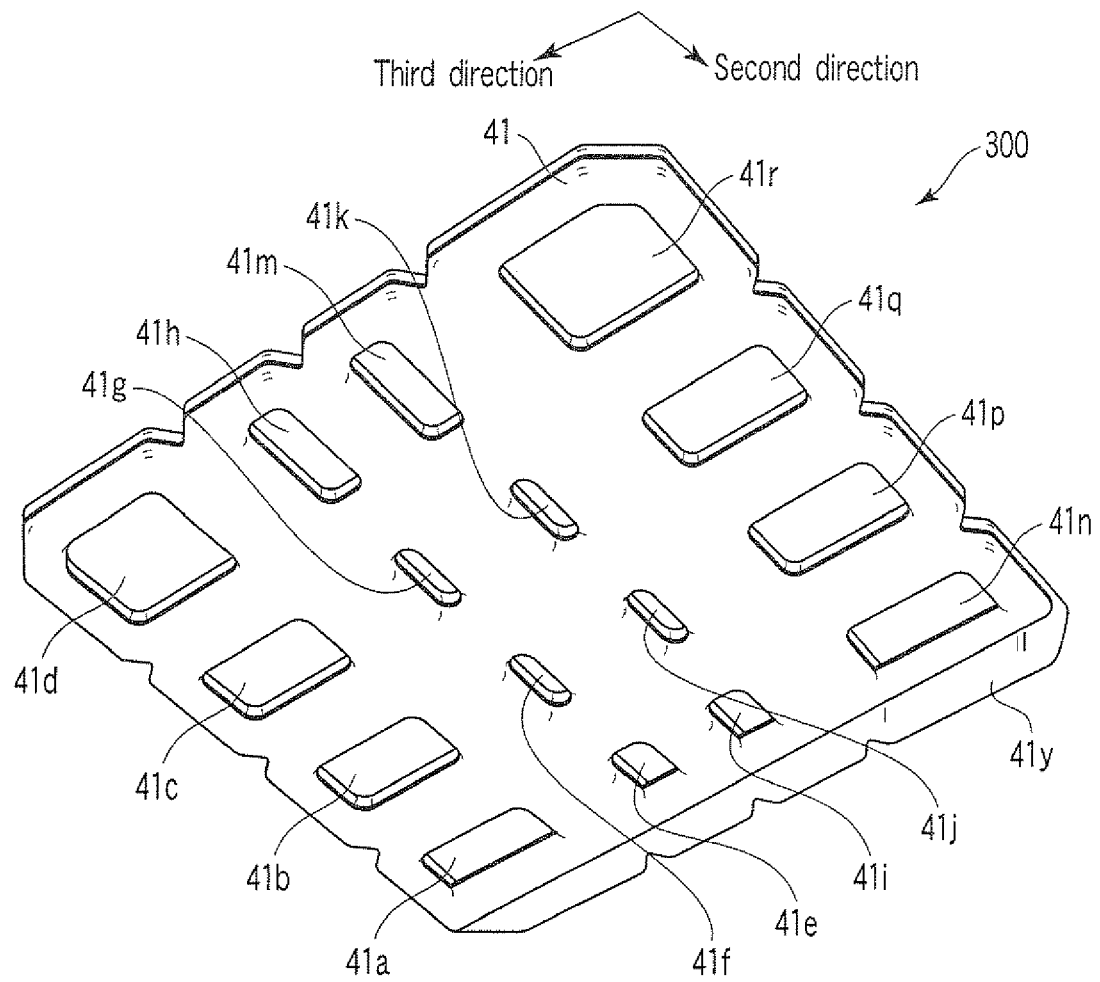
F I G. 7

HIGH FREQUENCY COIL DEVICE

CROSS-REFERENCE TO RELATED APPLICATIONS

This application is based upon and claims the benefit of priority from prior Japanese Patent Applications No. 2006-292973, filed Oct. 27, 2006; and No. 2007-245435, filed Sep. 21, 2007, the entire contents of both of which are incorporated herein by reference.

BACKGROUND OF THE INVENTION

1. Field of the Invention

The present invention is related to a high frequency coil device which receives a magnetic resonance signal occurred in a subject.

2. Description of the Related Art

In a magnetic resonance diagnostic apparatus, an array coil which is mounted with a number of loop coils are placed adjacent to the area of a subject being examined so as to receive weak magnetic resonance signals with good sensitivity (refer to, for example, Jpn. Pat. Appln. Publication KOKAI No. 5-2610081).

In the case where a number of loop coils are disposed, a mutual induction occurs between the loop coils. This mutual induction affects an electric circuit unit, such as a preamplifier circuit. Conventionally, in order to reduce such influence, the electric circuit unit, such as the preamplifier circuit, has been disposed at substantial distance from the loop coils.

However, when the loop coils and the preamplifier circuit are disposed apart, the transmission line therebetween becomes lengthened. Therefore, there was a problem that a magnetic resonance signal received by the loop coils may be attenuated significantly before entering the preamplifier circuit, thereby deteriorating signal-to-noise (S/N) characteristics.

BRIEF SUMMARY OF THE INVENTION

Under such circumstances, magnetic resonance signals have been required to be received with high quality by suppressing sensitivity degradation of loop coils which are placed adjacent to preamplifiers, while reducing transmission loss of the magnetic resonance signals between the loop coils and preamplifiers, in a situation where the preamplifiers are arranged adjacent to the loop coils.

According to a first aspect of the present invention, there is provided a high frequency coil device used in a magnetic resonance diagnostic apparatus, for receiving a magnetic resonance signal occurred in a subject, comprising: a plurality of high frequency loop coils arranged so that a part of their inner loop surface overlaps each other in a predetermined direction; and a first electric circuit arranged to overlap the inner loop surface of the plurality of high frequency loop coils in the predetermined direction, at a location where the inner loop surface of the plurality of high frequency loop coils overlaps each other, and including a preamplifier to amplify each of the magnetic resonance signals received by each of the plurality of loop coils.

According to a second aspect of the present invention, there is provided a high frequency coil device used in a magnetic resonance diagnostic apparatus, for receiving a magnetic resonance signal occurred in a subject, comprising: a plurality of high frequency loop coils arranged so that a part of them overlap each other; and an electric circuit which is arranged on or adjacent to a location where the plurality of high frequency loop coils overlap each other to process the magnetic resonance signal.

According to a third aspect of the present invention, there is provided a high frequency coil device used in a magnetic resonance diagnostic apparatus, for receiving a magnetic resonance signal occurred in a subject, comprising: a plurality of high frequency loop coils arranged so that a part of them overlap each other; and a plurality of preamplifiers arranged on or adjacent to a location where at least four high frequency loop coils among the plurality of high frequency loop coils overlap to amplify each of the magnetic resonance signals received by at least four of these high frequency loop coils.

According to a fourth aspect of the present invention, there is provided a high frequency coil device used in a magnetic resonance diagnostic apparatus, for receiving a magnetic resonance signal occurred in a subject, comprising: a plurality of high frequency loop coils arranged so that a part of them overlap each other; a plurality of preamplifiers arranged on or adjacent to a plurality of first overlapping portions among a plurality of overlapping portions formed by at least two of the plurality of high frequency loop coils overlapping each other, to amplify the magnetic resonance signal; and a synthesis circuit arranged on or adjacent to a second overlapping portion, which is different from the first overlapping portion, among the plurality of overlapping portions, to synthesize a plurality of magnetic resonance signals, which are respectively amplified by the plurality of preamplifiers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the preferred embodiments given below, serve to explain the principles of the invention.

FIG. 1 is a diagram illustrating a configuration of a magnetic resonance diagnostic apparatus related to a first embodiment of the present invention.

FIG. 6 is a sectional view of line B-B in FIG. 4.

FIG. 7 is a perspective view showing an external view of the high frequency coil device when observed from the opposite side of the external view shown in FIG. 4.

DETAILED DESCRIPTION OF THE INVENTION

Figure 2:
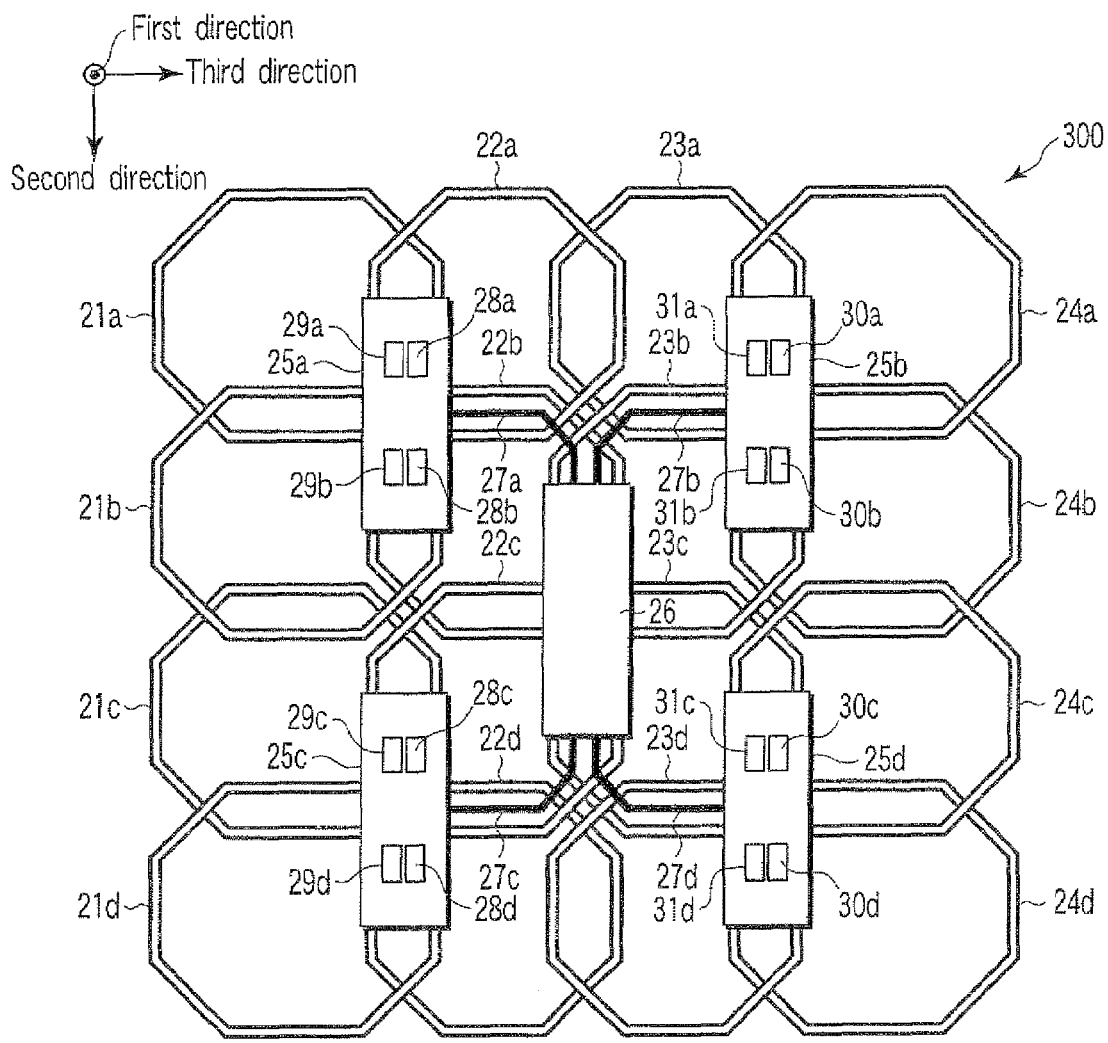
FIG. 2 is a diagram illustrating a configuration of a high frequency coil device which can be used as an RF coil unit in FIG. 1.

An embodiment of the present invention will be explained as follows in reference to the drawings.

FIG. 1 is a diagram illustrating a configuration of a magnetic resonance diagnostic apparatus 100 related to the present embodiment. The magnetic resonance diagnostic apparatus comprises a static field magnet 1, a gradient coil 2, a gradient power supply 3, a bed 4, a bed controller 5, RF coil units 6a, 6b and 6c, a transmitter 7, a selecting circuit 8, a receiver 9 and a computer system 10.

The static field magnet 1 is a hollow cylindrical member, which generates a uniform static magnetic field inside the hollow space. For instance, a permanent magnet or a superconducting magnet is used as the static field magnet 1.

The gradient coil 2 is also a hollow cylindrical member located inside the static field magnet 1. The gradient coil 2 is formed by a combination of three coils corresponding to three axes X, Y and Z which are perpendicular to each other. In the gradient coil 2, the three coils are individually supplied with a current from the gradient power supply 3, thereby generating gradient magnetic fields having their magnetic field intensities varied along the X, Y and Z axes. Assume here that the Z-axis direction corresponds to, for example, the magnetization direction of the static magnetic field. The gradient magnetic fields along the X, Y and Z axes correspond to, for example, a slice-selecting gradient magnetic field Gs, a phase-encoding gradient magnetic field Ge and a readout gradient magnetic field Gr, respectively. The slice-selecting gradient magnetic field Gs is used to determine an arbitrary imaging section. The phase-encoding gradient magnetic field Ge is used to change the phase of a magnetic resonance signal in accordance with its spatial position. The readout gradient magnetic field Gr is used to change the frequency of a magnetic resonance signal in accordance with its spatial position.

A subject 200 placed on a top board 4a of the bed 4 is inserted into the cavity (imaging space) of the gradient coil 2 along with the bed 4. The top board 4a of the bed 4 is longitudinally (horizontally in FIG. 1) and vertically driven by the bed controller 5. Normally, the bed 4 is positioned with its longitudinal direction set parallel to the axis of the static field magnet 1.

The RF coil unit 6a is made by arranging one or a plurality of coils in a cylindrical case. The RF coil unit 6a is located inside the gradient coil 2, and is used to generate a high-frequency magnetic field upon receiving a high-frequency pulse (an RF pulse) signal from the transmitter 7.

RF coil units 6b and 6c are mounted on the top board 4a, built in the top board 4a, or attached to the subject 200. When imaging is performed, they are inserted into the imaging space along with the subject 200. Array coils are used as RF coil units 6b and 6c. In other words, each of the RF coil units 6b and 6c includes a plurality of element coils. Each of the element coils of RF coil units 6b and 6c receives magnetic resonance signals radiating from the subject 200. Output signals from each element coil are supplied to the selecting circuit 8, individually. The RF coil units for signal reception are not limited to the RF coil units 6b and 6c described above, and various types of RF coil units may be arbitrarily used for signal reception. In addition, the RF coil units are not limited to two in number. A single RF coil unit may be used; alternatively, three or more RF coil units may be used.

The transmitter 7 transmits an RF pulse signal corresponding to the Larmor frequency to RF coil unit 6a.

The selecting circuit 8 selects signals from a plurality of magnetic resonance signals output from RF coil units 6b and 6c. The selecting circuit 8 supplies the selected magnetic resonance signals to the receiver 9. The computer system 10 designates which channel to select.

The receiver 9 includes processing systems corresponding to a plurality of channels, and each processing system includes a preamplifier, a phase detection unit and an analog/digital converter. Magnetic resonance signals selected by the selecting circuit 8 are supplied to these plural-channel processing systems. The preamplifier amplifies magnetic resonance signals. The phase detection unit detects the phase of the magnetic resonance signals output from the preamplifier. The analog/digital converter converts the signals output from the phase detection unit to digital signals. The receiver 9 outputs digital signals produced from each processing system.

The computer system 10 includes an interface 11, a data collection unit 12, a reconstruction unit 13, a memory 14, a display unit 15, an input unit 16 and a main controller 17.

The interface 11 is connected to the gradient power supply 3, bed controller 5, transmitter 7, receiver 9, selecting circuit 8, etc. The interface 11 permits signals to be exchanged between each of these connected units and the computer system 10.

The data collection unit 12 collects digital signals output from the receiver 9. The data collection unit 12 stores the collected digital signals, i.e., magnetic resonance signal data, in the memory 14.

The reconstruction unit 13 performs post-processing such as Fourier transform on the magnetic resonance signal data stored in the memory 14, thereby acquiring spectrum data or image data corresponding to a desired nuclear spin in the subject 200.

The memory 14 stores the magnetic resonance signal data and spectrum data or image data of each subject.

The display unit 15 displays various information items, such as spectrum data or image data, etc., under the control of the controller 17. The display unit 15 may be a liquid crystal display, for example.

The input unit 16 receives various instructions or information items input by an operator. The input unit 16 may be a pointing device, such as a mouse or a track ball, a selective device, such as a mode switch, or an input device, such as a keyboard.

The main controller 17 includes a CPU, a memory, etc., and controls the entire magnetic resonance diagnostic apparatus 100.

FIG. 2 is a diagram illustrating a high frequency coil device 300 which can be used as an RF coil unit 6c.

The high frequency coil device 300 includes loop coils 21a to 21d, 22a to 22d, 23a to 23d and 24a to 24d, electric circuit units 25a to 25d and 26, and signal lines 27a to 27d. The loop coils 21a to 21d, 22a to 22d, 23a to 23d and 24a to 24d are arranged so that the inner loop surface of the loops face the same direction (hereinafter, referred to as a first direction), and a part of adjacent loops overlap in the first direction as well. Each of the loop coils 21a to 21d, 22a to 22d, 23a to 23d and 24a to 24d are arranged along a second direction. Each of the loop coils 21a, 22a, 23a and 24a, loop coils 21b, 22b, 23b and 24b, loop coils 21c, 22c, 23c and 24c, loop coils 21d, 22d, 23d and 24d are arranged along a third direction perpendicular to the second direction. The loop coils 21a to 21d, 22a to 22d, 23a to 23d, and 24a to 24d are, for example, formed on a glass epoxy substrate as a pattern of a mutually insulated conductive material.

Further, the second and third directions are both perpendicular to the first direction. Usually, when the high frequency coil device 300 is used as the RF coil unit 6c, the first, second and third directions are respectively adjusted to the directions of the Y, Z and X axes.

The inner loop surface width of each loop coil in the second direction is equivalent. The inner loop surface width of loop coils in the third direction is equivalent with respect to loop coils 21a to 21d and 24a to 24d, and with respect to loop coils 22a to 22d and 23a to 23d. The width of loop coils 22a to 22d and 23a to 23d are respectively smaller than the width of loop coils 21a to 21d and 24a to 24d. However, the inner loop surface width of each loop coil may be optional.

The overlapping amount between the adjacent loop coils is set to an amount which is capable of neutralizing mutual induction between the adjacent loop coils. In other words, to suppress electric coupling of the two loop coils, it is set to an appropriate amount in which the high frequency magnetic fields occurring mutually totals "0" within the loops.

In the case where the high frequency coil device 300 is used as the RF coil unit 6c, the inner loop surface of each loop coil is arranged along the upper surface of the top board 4a with the second direction arranged in the longitudinal direction of the top board 4a. In such manner the inner loop surface of each loop coil faces the subject 200 placed on the top board 4a. Since the subject 200 is placed on the top board 4a with its axis in the longitudinal direction of the top board 4a, the third direction intersects with the axis direction of the subject 200.

The electric circuit units 25a to 25d and 26 are arranged so that they overlap the overlapped portions of each loop coil in the first direction. For example, the electric circuit unit 25a is arranged so that it overlaps the portion where the loop coil 21a and the loop coil 22a overlap and the portion where the loop coil 21b and the loop coil 22b overlap.

The electric circuit units 25b to 25d and 26 are also arranged in a similar manner as the electric circuit unit 25a, however, respectively on different loop coils. Each of the electric circuit units 25a to 25d are provided with four channels of, such as, a preamplifier, tuning circuit and balun. The electric circuit units 25a to 25d amplify the magnetic resonance signals output from each of the overlapping four loop coils. The electric circuit unit 26 is connected to each of the electric circuit units 25a to 25d by signal lines 27a to 27d. In FIG. 2, each of the numerals 28a to 28d, 29a to 29d, 30a to 30d, and 31a to 31d indicate a preamplifier. In other words, the electric circuit unit 25a is provided with preamplifiers 28a, 28b, 29a and 29b, the electric circuit unit 25b is provided with preamplifiers 30a, 30b, 31a and 31b, the electric circuit unit 25c is provided with preamplifiers 28c, 28d, 29c and 29d, and the electric circuit unit 25d is provided with preamplifiers 30c, 30d, 31c and 31d. The preamplifiers 28a to 26d correspond respectively to loop coils 21a to 21d, the preamplifiers 29a to 29d correspond respectively to loop coils 22a to 22d, the preamplifiers 30a to 30d correspond respectively to loop coils 23a to 23d, and the preamplifiers 31a to 31d correspond respectively to loop coils 24a to 24d.

Each of the loop coils 21a to 21d, 22a to 22d, 23a to 23d, and 24a to 24d are provided with a gap and trap circuit on the portions where the electric circuit units 25a to 25d overlap.

Figure 3:
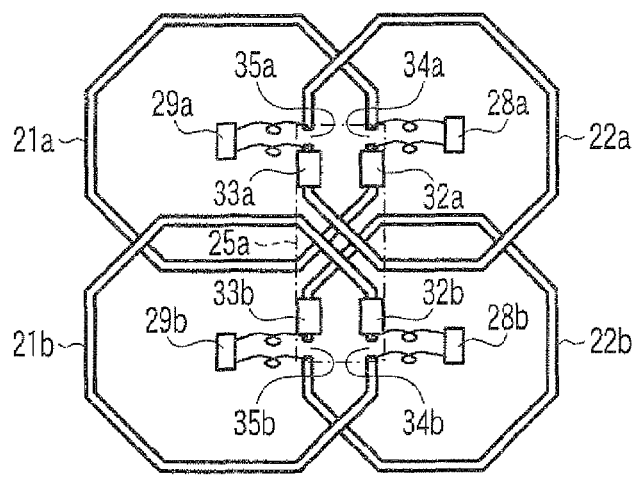
FIG. 3 is a diagram illustrating a configuration of loop coils, on which portion an electric circuit unit overlaps in FIG. 2.

FIG. 3 is a diagram illustrating a configuration of loop coils on which portion the electric circuit unit 25a overlaps.

Trap circuits 32a, 32b, 33a and 33b are mounted respectively on loop coils 21a, 21b, 22a and 22b, in the location where the electric circuit unit 25a overlaps. In addition, the loop coils 21a, 21b, 22a and 22b are provided with gaps 34a, 34b, 35a and 35b, in the location where the electric circuit unit 25a overlaps. Preamplifiers 28a, 28b, 29a and 29b are connected to both ends of each of the loop coils 21a, 21b, 22a and 22b between the gaps 21a, 21b, 22a and 22b.

Further, portions where the electric circuit units 25b to 25c overlap also have a similar structure as FIG. 3.

In the structure above, each of the preamplifiers 28a to 28d, 29a to 29d, 30a to 30d and 31a to 31d is arranged adjacent to the corresponding loop coils 21a to 21d, 22a to 22d, 23a to 23d and 24a to 24d. Therefore, each signal line to connect the loop coils 21a to 21d, 22a to 22d, 23a to 23d and 24a to 24d with the preamplifiers 28a to 28d, 29a to 29d, 30a to 30d and 31a to 31d can be shortened, thereby reducing transmission loss of the magnetic resonance signal. Further, since the electric circuit units 25a to 25d are arranged to circumvent each loop axis of loop coils 21a to 21d, 22a to 22d, 23a to 23d and 24a to 24d, the degradation of receiving sensitivity of each loop coil, which is caused by the influence of the electric circuit units 25a to 25d, can be reduced.

The electric circuit unit 26 comprises a synthesis circuit which collects magnetic resonance signals of a total of 16 channels, from four channels each of the electric circuit units 25a to 25d via the signal lines 27a to 27d, and which synthesizes these magnetic resonance signals. For instance, this synthesis circuit considers four loop coils arranged in the third direction as a set and subjects the magnetic resonance signals of four channels with respect to the four loop coils of the set to QD synthesis to generate four pieces of synthesized signals per set. These four pieces of synthesized signals are an in-phase synthesized signal, an anti-phase synthesized signal, a QD signal and an anti-QD signal. The in-phase synthesized signal is obtained by subjecting the magnetic resonance signals received by each of the two outer loop coils of the set to in-phase synthesis. The anti-phase synthesized signal is obtained by subjecting the magnetic resonance signal received by each of the two inner loop coils of the set to anti-phase synthesis. The QD signal is obtained by subjecting a signal obtained by anti-phase synthesizing the magnetic resonance signal received by each of the two outer loop coils of the set, and a signal obtained by in-phase synthesizing the magnetic resonance signal received by each of the two inner loop coils of the set to in-phase synthesis. The anti-QD signal is obtained by subjecting a signal obtained by anti-phase synthesizing the magnetic resonance signal received by two outer loop coils of the set, and a signal obtained by in-phase synthesizing the magnetic resonance signal received by each of the two inner loop coils of the set to anti-phase synthesis. The electric circuit unit 26 outputs four signals per set, i.e. a total of 16 synthesized signals, via a cable which is not shown in the drawings.

The signal lines 27a to 27d are all arranged along the portions where the loop coils overlap each other. In such manner, mutual induction between the signal lines and the loop coils can be reduced.

The high frequency coil device 300 is covered with a cushioning material comprised of, for example, foamed polyethylene.

Figure 4:
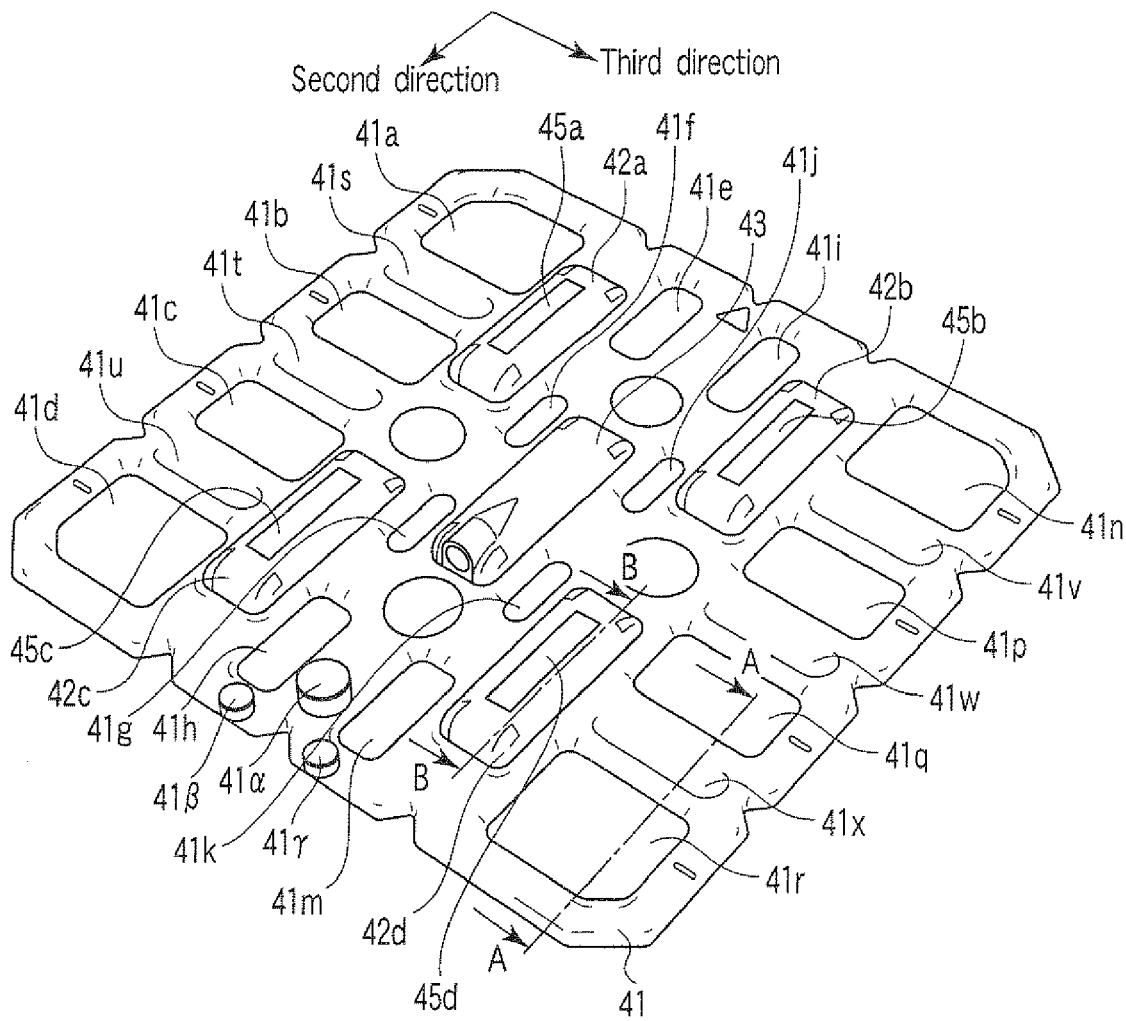
FIG. 4 is a perspective view showing an external view of the high frequency coil device provided with the configuration shown in FIG. 2.
Figure 5:
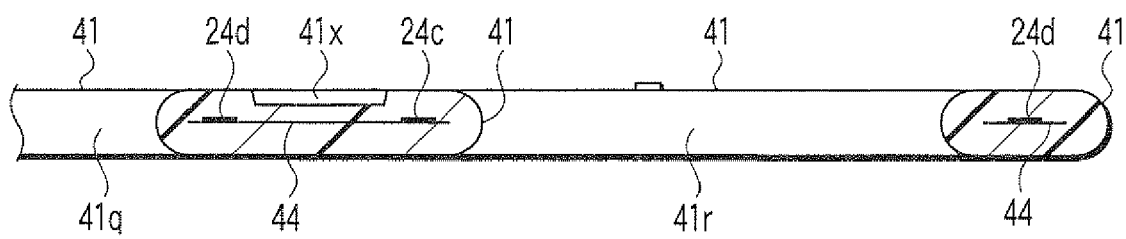
FIG. 5 is a sectional view of line A-A in FIG. 4.

FIG. 4 is a perspective view showing an external view of the high frequency coil device 300 covered with the cushioning material 41. FIG. 5 is a sectional view of line A-A in FIG. 4.

The cushioning material 41 has a core, which is the glass epoxy substrate 44 supporting the loop coil, and covers the glass epoxy substrate 44 entirely. Therefore, the cushioning material 41 has openings 41a to 41r which respectively go through the loops of each of the loop coils 21a to 21d, 22a to 22d, 23a to 23d and 24a to 24d.

These openings 41a to 41r can effectively release heat generated by the loop coils 21a to 21d, 22a to 22d, 23a to 23d, and 24a to 24d. In addition, by providing the openings 41a to 41r, the amount of cushioning material 41 can be reduced, thereby achieving weight reduction. Further, in the case where the high frequency coil device 300 is mounted on the subject 200, the openings 41a to 41r may provide ventilation to ease discomfort for the subject 200.

Among the openings arranged in the second direction, the openings located on the outer side have larger opening areas than those located on the inner side of the second direction. In other words, each opening area of the openings 41a and 41d, 41e and 41h, 41i and 41m, and 41n and 41r is larger than that of the openings 41b and 41c, 41f and 41g, 41j and 41k, and 41p and 41q, respectively.

In this manner, the heat generated by the loop coils 21a to 21d, 22a to 22d, 23a to 23d and 24a to 24d can be released more effectively, and a further reduction in weight can be attempted.

Concaves 41s to 41x are formed on the chased surface of the cushioning material 41. The concave portions 41s to 41x are formed adjacent to each of overlapping portions of loop coil 21a and loop coil 21b, loop coil 21b and loop coil 21c, loop coil 21c and loop coil 21d, loop coil 24a and loop coil 24b, loop coil 24b and loop coil 24c, or loop coil 24c and loop coil 24d, respectively.

As shown in FIG. 5, since a glass epoxy substrate 44 exists in the overlapped portions, it is not preferred to provide openings thereto Therefore, weight reduction is attempted by forming concaves 41s to 41x.

Meanwhile, concave portions may be formed on the opposite side of the concave portions 41s to 41x.

On the cushioning material 41, a convex portion 41 α is Formed between the opening 41h and opening 41m. In addition, convex portions 41β and 41γ are formed respectively at the end of the cushioning material 41, in the second direction of each of the openings 41h and 41m.

The cushioning material 41 has pit portions formed thereon, which do not cover the electric circuit units 25a to 25d and 26. Instead, covers 42a and 42d are mounted to cover the electric circuits 25a to 25d and 26.

FIG. 6 is a sectional view of line B-B in FIG. 4. Further, the drawing of the loop coil is omitted in FIG. 6.

The cover 42d is screwed on a fixture 51 by screws 52a and 52b. The fixture 51 sandwiches and holds the glass epoxy substrate 44. Parts of the fixture 51 rise vertically against the glass epoxy substrate 44 to form convexes 51a and 51b.

A substrate 53 of the electric circuit unit 25d is sandwiched and held between the apical surfaces of convex portions 51a and 51b and the cover 42d. In this manner, the convex portions 51a and 51b function as a spacer to set the electric circuit unit 25d apart from the glass epoxy substrate 44. In addition, the convex portions 51a and 51b are hollow so that screws 52a and 52b can be inserted. Further, the convex portions 51a and 51b hold a shield plate 54 so that it is positioned between the glass epoxy substrate 44 and the electric circuit unit 25d. The shield plate 54 is, for instance, comprised of a copper plate and functions as a shield between the glass epoxy substrate 44 and the electric circuit 25d.

Covers 42b to 42c have similar configurations as FIG. 6.

Since the electric circuit units 25a to 25d overlap the portions where the loop coils overlap, though small, mutual induction is generated therebetween. However, by arranging the shield plate 54, such mutual induction can be reduced, thereby further improving the loop coil sensitivity.

As shown in FIG. 4, the surface of the covers 42b to 42c are chased to form concave portions 45a to 45d. By forming these concave portions 45a to 45d, weight reduction may be achieved, and heat generated by the electric circuit units 25a to 25d can be released outside the covers 42a to 42d efficiently.

FIG. 7 is a perspective view showing an external view of the high frequency coil device 300 when observed from the opposite side shown in FIG. 4.

As shown in FIG. 7, there is a leveled portion 41y formed on the cushioning material 41. This leveled portion 41y is formed so that each end of the loop coils 21a, 22a, 23a and 24a juts out on the leveled portion 41y.

Figure 8:
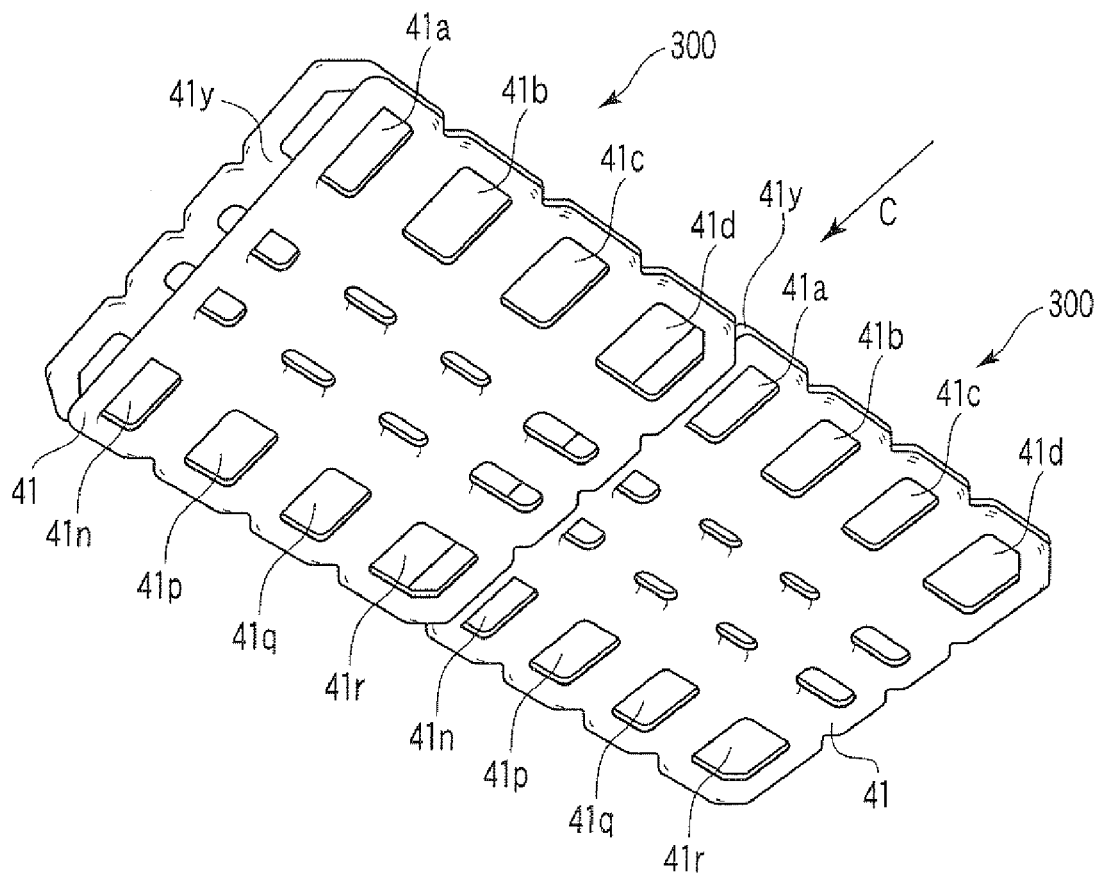
FIG. 8 is a perspective view showing the status of use when two high frequency coil devices shown in FIG. 4 are combined and used.
Figure 9:
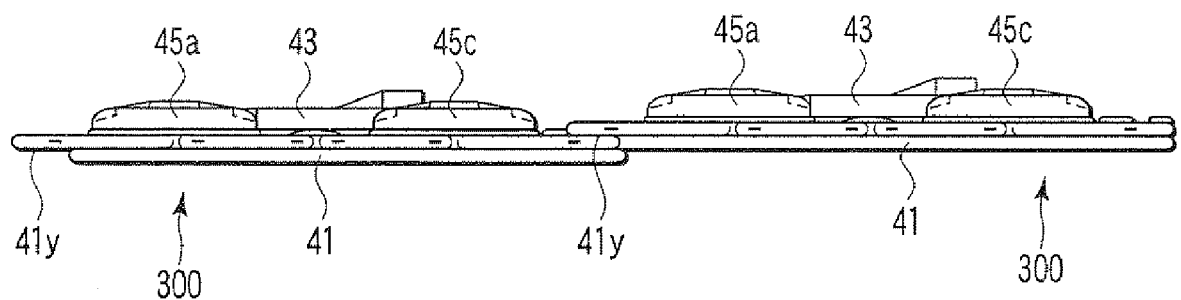
FIG. 9 is a diagram illustrating a view of the two high frequency coil device when observed from the direction shown by an arrow C in FIG. 8.

FIG. 8 is a perspective view showing the status of use when two high frequency coil devices 300 are combined and used. FIG. 9 is a diagram illustrating a view observed from the direction shown by an arrow C in FIG. 8.

As shown in FIGS. 8 and 9, by striking the end of a high frequency coil device 300 against the leveled portion 41y of another high frequency coil device 300, a part of the loop coils 21d, 22d, 23d and 24d provided on the high frequency coil device 300 can overlap respectively on a part of the loop coils 21a, 22a, 23a and 24a provided on the other high frequency coil device 300. Further, by providing the leveled portion 41y, the distance between the loop coils 21d, 22d, 23d and 24d provided on the high frequency coil device 300 and the loop coils 21a, 22a, 23a and 24a provided on the other high frequency coil device 300 in the first direction can be made smaller than in the case of not providing the leveled portion 41y.

Figure 10:
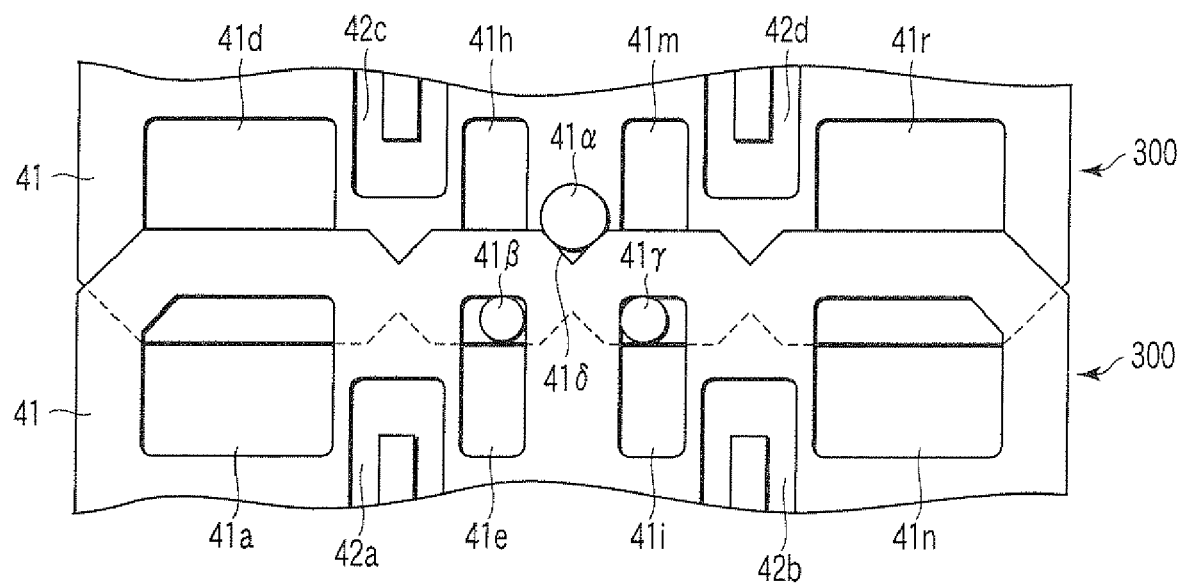
FIG. 10 is a plan view of a portion where two high frequency coil devices overlap when the two high frequency coil devices are combined as shown in FIG. 8.

FIG. 10 is a plan view of a portion where two high frequency coil devices 300 overlap when the two high frequency coil devices 300 are combined as shown in FIG. 8.

As shown in FIG. 10, in a condition where two high frequency coil devices 300 are combined, a convex portion 41α formed on the cushioning material 41 of a high frequency coil device 300 is fitted into a groove 41 δ formed along the side surface of the cushioning material 41 of another high frequency coil device 300. Meanwhile, the convex portions 41β and 41γ formed on the cushioning material 41 of the high frequency coil device 300 are respectively inserted into the openings 41e and 41i formed on the cushioning material 41 of the other high frequency coil device 300. The convex portions 41β and 41γ are positioned so that they sandwich the member positioned between the opening 41e and the opening 41i as shown in FIG. 10.

In this manner, relative positions of the two high frequency coil devices 300 with regard to the second and third directions are determined. In addition, by engaging the convex portions 41β and 41γ respectively with the openings 41e and 41i, the two high frequency coil devices 300 may he prevented from easily parting in the second direction.

Figure 11:
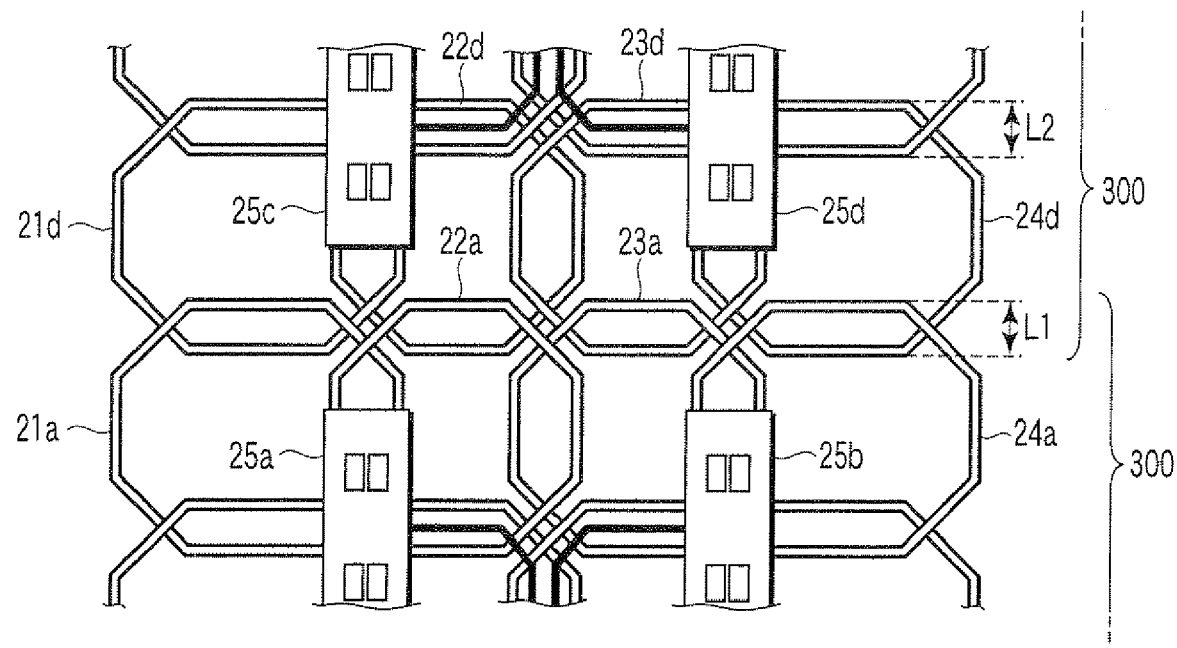
FIG. 11 is a plan view showing the aspect of the loop coils where two high frequency coil devices overlap when the two high frequency coil devices are combined as shown in FIG. 8.

FIG. 11 is a plan view showing the aspect of the loop coils at the overlapped portion of both high frequency coil devices 300 in a condition where the two high frequency coil devices 300 are combined as shown in FIG. 8.

With the various engagements mentioned above, the loop coils 21d, 22d, 23d and 24d provided on the end of a high frequency coil device 300 and the loop coils 21a, 22a, 23a and 24a provided on the end of another high frequency coil device 300 are arranged respectively along the second direction as shown in FIG. 11. Further, an overlapping amount L1 between the loop coils 21d, 22d, 23d and 24d provided on the end of the high frequency coil device 300 and the loop coils 21a, 22a, 23a and 24a provided on the end of the other high frequency coil device 300 will be approximately the same as an overlapping amount L2 between loop coils adjacent to each other in one high frequency coil device 300. In this manner, a total of 32 loop coils arranged on the two high frequency coil devices 300 can be easily formed in a 4 by 8 arrangement.

This embodiment can be modified as follows.

The number of loop coils may be in arbitrary numbers of two or more. Further, the arrangement of the loop coils may be arbitrary as long as an overlapping portion can be formed between the loop coils.

The number of electric circuit units may be in arbitrary numbers as well. For example, while the loop coils are arranged as in the above embodiment, each of the eight electric circuit units provided with two channels of, such as, preamplifiers, may be arranged to correspond with two loop coils, respectively. In this case, the electric circuit unit should be arranged on the overlapped portion of the two loop coils corresponding thereto. Instead, it is also possible to arrange each of the two electric circuit units provided with eight channels of, such as, preamplifiers, to correspond with eight loop coils, respectively. In this case, the electric circuit unit should be arranged on the portion where any two or more loop coils overlap among the eight loop coils corresponding thereto.

Not all distinctive configurations mentioned above need to be provided.

In the above embodiment, the electric circuit units 25a to 25d and 26 slightly protrude from the overlapped portion of the loop coils. Since the protrusion is minor, the influence on reception quality is minor. However, by arranging the entire electric circuit unit on the overlapped portion of the loop coils, it is possible to reduce the influence of the electric circuit unit on the reception quality to a further extent.

The synthesis circuit provided on the electric circuit unit 26 may include an arbitrary loop coil in a set for performing signal synthesis. For example, a set may respectively include four loop coils arranged in the second direction, two loop coils arranged in the first or second direction, or four loop coils arranged in 2 by 2.

The electric circuit unit 26 may be arranged outside the high frequency coil device 300.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high frequency coil device used in a magnetic resonance diagnostic apparatus, for receiving a magnetic resonance signal occurred in a subject, comprising:
    a plurality of high frequency loop coils arranged so that a part of their inner loop surface overlaps each other in a predetermined direction; and
    a first electric circuit arranged to overlap the inner loop surface of the plurality of high frequency loop coils in the predetermined direction, at a location where the inner loop surface of the plurality of high frequency loop coils overlaps each other, and including a preamplifier to amplify each of the magnetic resonance signals received by each of the plurality of loop coils.

2. The high frequency coil device according to claim 1, wherein the plurality of high frequency loop coils and the first electric circuit are formed respectively on each of different first and second substrates.

3. The high frequency coil device according to claim 2, wherein a shield plate is provided between the first substrate and the second substrate.

4. The high frequency coil device according to claim 2, further comprising a plurality of trap circuits mounted on each of the plurality of high frequency loop coils to shield induced power generated in the transmit high frequency magnetic field, wherein
    the plurality of trap circuits arranged on the first substrate so that they overlap with the second substrate.

5. The high frequency coil device according to claim 1, provided with a plurality of coil groups comprised of the plurality of high frequency loop coils and the first electric circuit.

6. The high frequency coil device according to claim 5, wherein the plurality of coil groups are arranged so that at least one of the high frequency loop coils included in each coil group overlaps with the high frequency loop coil included in another coil group in the predetermined direction, and
    further comprising a second electric circuit including a synthesis circuit to synthesize signals output from the first electric circuit of each of the plurality of coil groups.

7. The high frequency coil device according to claim 6, wherein a signal line to transmit a signal from the first electric circuit to the second electric circuit is arranged to overlap in the predetermined direction with respect to the portion where the inner loop surfaces of the high frequency loop coils overlap each other in the predetermined direction.

8. The high frequency coil device according to claim 1, further comprising a cushioning material which covers the plurality of high frequency loop coils.

9. The high frequency coil device according to claim 8, wherein the cushioning material has an engagement structure which engages with a cushioning material of another high frequency coil device, the said engagement structure having a configuration in which a part of a inner loop surface of at least one each of the high frequency loop coils included in two high frequency coil devices overlaps each other in the predetermined direction.

10. The high frequency coil device according to claim 8, wherein the cushioning material has an opening along a loop axis of the high frequency loop coil.

11. The high frequency coil device according to claim 10, wherein the cushioning material has a plurality of openings arranged in a predetermined arranging direction, and opening areas of the openings located on the outside of the arranging direction are made larger than the openings located on the inside of the arranging direction.

12. The high frequency coil device according to claim 8, wherein the cushioning material has a concave portion formed by caving in the surface thereof toward a space between conductors of two high frequency loop coils at a location where the inner loop surfaces of the said two high frequency loop coils overlap each other.

13. The high frequency coil device according to claim 8, wherein the cushioning material has a pit portion which not covers the first electric circuit, and
    the high frequency coil device further comprises a cover to cover the first electric circuit at the pit portion.

14. The high frequency coil device according to claim 13, wherein the cover has a concaved surface.

15. A high frequency coil device used in a magnetic resonance diagnostic apparatus, for receiving a magnetic resonance signal occurred in a subject, comprising:
    a plurality of high frequency loop coils arranged so that a part of them overlap each other; and an electric circuit which is arranged on or adjacent to a location where the plurality of high frequency loop coils overlap each other to process the magnetic resonance signal.

16. A high frequency coil device used in a magnetic resonance diagnostic apparatus, for receiving a magnetic resonance signal occurred in a subject, comprising:

a plurality of high frequency loop coils arranged so that a part of them overlap each other; and a plurality of preamplifiers arranged on or adjacent to a location where at least four high frequency loop coils among the plurality of high frequency loop coils overlap to amplify each of the magnetic resonance signals received by at least four of these high frequency loop coils.

17. A high frequency coil device used in a magnetic resonance diagnostic apparatus, for receiving a magnetic resonance signal occurred in a subject, comprising:

a plurality of high frequency loop coils arranged so that a part of them overlap each other;

a plurality of preamplifiers arranged on or adjacent to a plurality of first overlapping portions among a plurality of overlapping portions formed by at least two of the plurality of high frequency loop coils overlapping each other, to amplify the magnetic resonance signal; and a synthesis circuit arranged on or adjacent to a second overlapping portion, which is different from the first overlapping portion, among the plurality of overlapping portions, to synthesize a plurality of magnetic resonance signals, which are respectively amplified by the plurality of preamplifiers.

* * * * *